United States Patent
Carpenter et al.

(10) Patent No.: US 6,581,194 B1
(45) Date of Patent: Jun. 17, 2003

(54) METHOD FOR REDUCING SIMULATION OVERHEAD FOR EXTERNAL MODELS

(75) Inventors: David W. Carpenter, Monument, CO (US); Jana L. Richards, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/882,899

(22) Filed: Jun. 15, 2001

(51) Int. Cl.[7] .............................................. G06F 17/50
(52) U.S. Cl. .............................................. 716/4; 716/5
(58) Field of Search .............................. 716/4, 5, 3, 1; 703/13, 22

(56) References Cited

U.S. PATENT DOCUMENTS

| | | | | |
|---|---|---|---|---|
| 5,594,741 A | * | 1/1997 | Kinzelman et al. | 706/920 |
| 6,163,763 A | * | 12/2000 | Cox et al. | 703/14 |
| 6,182,258 B1 | * | 1/2001 | Hollander | 714/739 |

\* cited by examiner

*Primary Examiner*—Haissa Philogene
*Assistant Examiner*—Thuy Vinh Tran

(57) ABSTRACT

A method for simulating verification of an IC design. The method generally comprises the steps of (A) generating one or more transactions of a simulation and (B) testing the one or more transactions and possibly generating an exception. The exception may be configured to initiate a modification of step (A).

20 Claims, 2 Drawing Sheets

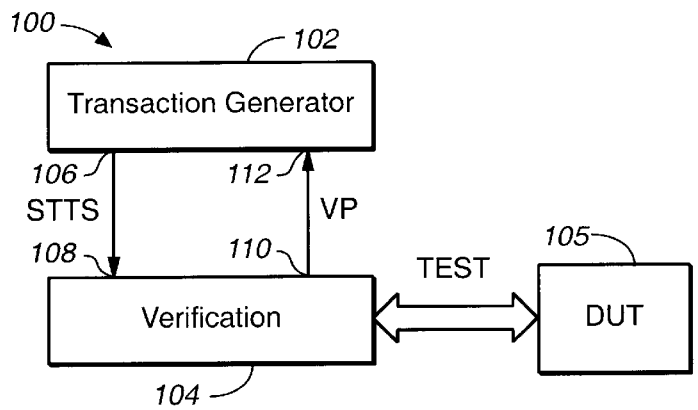
FIG._1
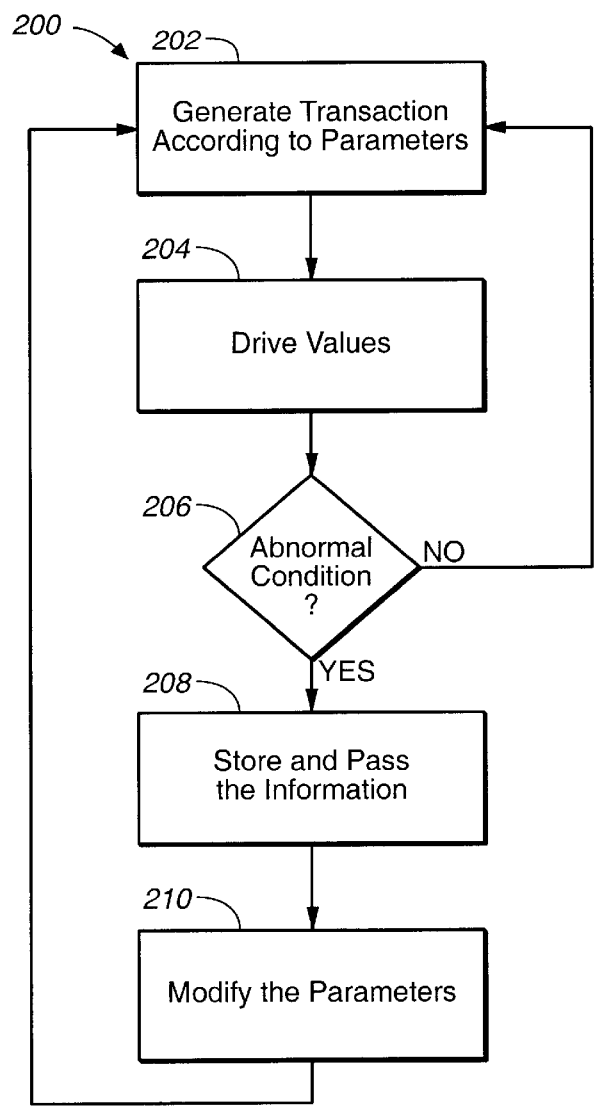
FIG._3

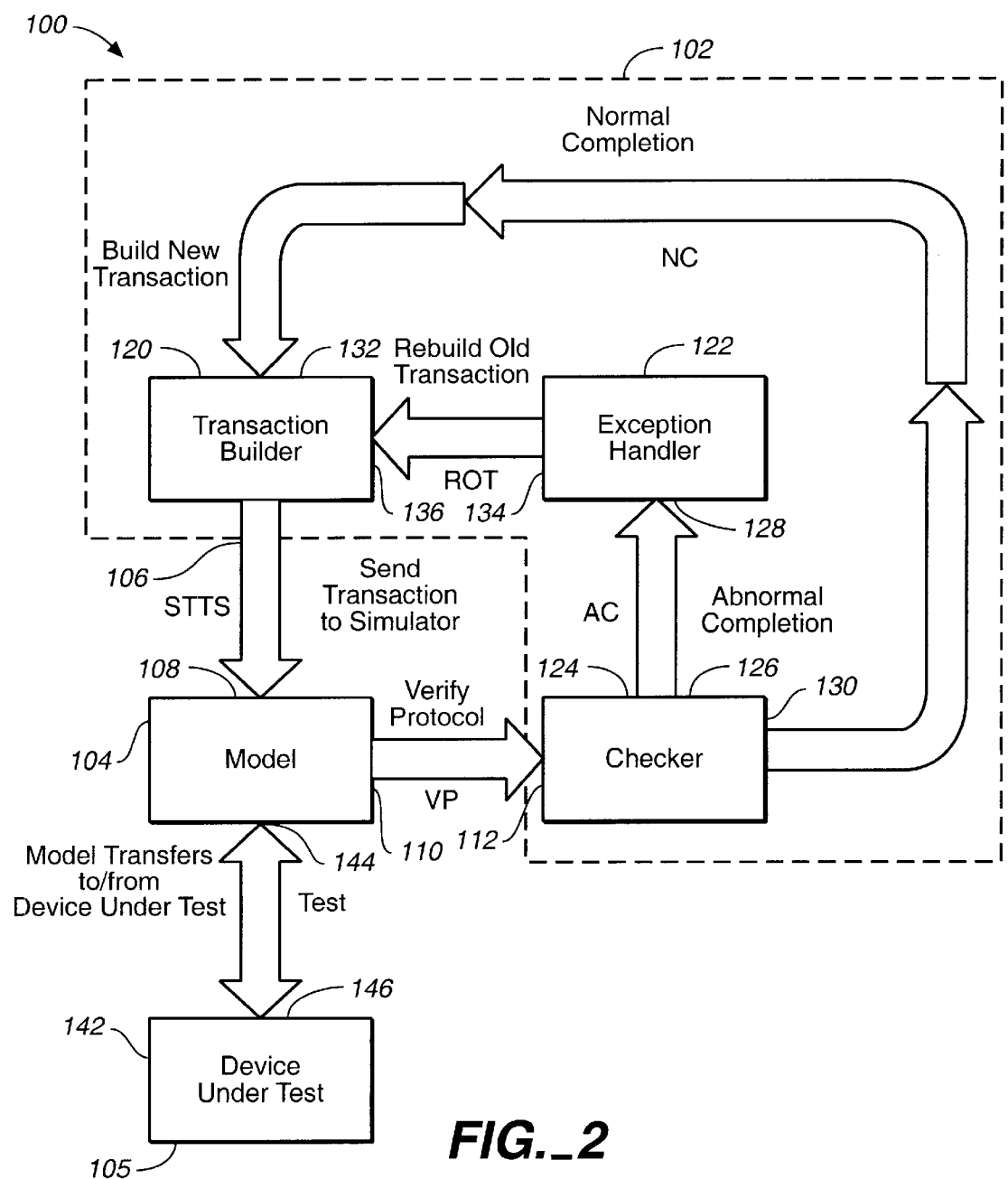
FIG._2

METHOD FOR REDUCING SIMULATION OVERHEAD FOR EXTERNAL MODELS

FIELD OF THE INVENTION

The present invention relates to a method and/or apparatus for verification of integrated circuit (IC) designs generally and, more particularly, to a method and/or apparatus for reducing simulation overhead for external models.

BACKGROUND OF THE INVENTION

Conventional integrated circuit (IC) model applications are written in simulator languages and can implement third party tools requiring additional third party extension languages. IC models are typically built in one of three languages. The first language may be a proprietary simulator language. The proprietary simulator language allows designers to clearly understand the IC model and perform modifications, if necessary. However, such proprietary simulator languages have limited capabilities and require increased coding when compared to the third party extension languages, causing simulation slow down. Writing IC models in proprietary simulator language is inefficient, since the simulator languages do not allow for re-entrant tasks, (i.e., no reusability of code is provided). Furthermore, hardware design languages are geared toward designing hardware, not test bench models.

The second language is the C/C++ language. The third language is the third party simulator extension language. The C/C++ language and the third party extension language allow IC modeling to be accomplished with current software standards and provide increased reusability. However, C/C++ and third party extension languages require the IC model to communicate with the simulator through an interface. The interface significantly slows down the entire simulation process. Moreover, as the complexity of IC models increases, communication with the simulator increases, greatly reducing the throughput of the simulator.

Some conventional IC design simulators have attempted to speed up or accelerate simulation through other languages. However, IC model interfacing with the simulator remains slow and interfacing with the simulator is not reduced.

SUMMARY OF THE INVENTION

The present invention concerns a method for simulating verification of an IC design. The method generally comprises the steps of (A) generating one or more transactions of a simulation and (B) testing the one or more transactions and possibly generating an exception. The exception may be configured to initiate a modification of step (A).

The objects, features and advantages of the present invention include providing a method and/or apparatus for reducing simulation overhead for integrated circuit (IC) models that may (i) allow a checker and a transaction generator to be simultaneously built, (ii) allow the checker to become integrated into the IC design, and/or (iii) allow the speed of the simulation to be directly dependent upon the simulator.

BRIEF DESCRIPTION OF THE DRAWINGS

These and other objects, features and advantages of the present invention will be apparent from the following detailed description and the appended claims and drawings in which:

FIG. 1 is a block diagram of a preferred embodiment of the present invention;

FIG. 2 is a detailed block diagram of the present invention; and

FIG. 3 is a flow chart illustrating an operation of the present invention.

DETAILED DESCRIPTION OF THE PREFERRED EMBODIMENTS

Referring to FIG. 1, a block diagram of a system (or device) 100 is shown in accordance with a preferred embodiment of the present invention. The system 100 may provide verification of integrated circuit (IC) designs through simulation. The system 100 may reduce simulation overhead for integrated circuit (IC) designs. The system 100 may allow a checker and a transaction generator to be built substantially simultaneously, since the transaction generator may be required to have to modify an original transaction. The system 100 may allow the checker to be integrated into the model. Furthermore, the system 100 may allow a speed of the IC design simulation to be directly dependent upon the simulator and not limited by the models interfacing with the simulator.

IC designs are typically programmed (or built) in one of three languages. The first language may be a simulator language. The simulator language may allow designers to clearly understand the model design and implement modifications. The second language may be the C/C++ language and the third language may be a third party simulator extension language. The C/C++ language and the third party extension language may allow IC modeling to be accomplished with current software standards, providing increased reusability. The system 100 may provide an improved method for verification of IC designs with reduced simulator overhead.

The system 100 generally comprises a first block (or device) 102 and a second block (or device) 104 and a device under test (DUT) 105. The block 102 may be implemented as a transaction generator section. The block 104 may be implemented as a verification section. The first section 102 may be implemented in a third party extension or C/C++ language. The second section 104 may be implemented as model driver in a simulator. The block 102 may have an output 106 that may derive (or generate) one or more signals on a bus (e.g., STTS) connected to an input 108 of the block 104. The bus STTS may be configured to send/receive transactions between the block 102 and the block 104. The block 104 may have an output 110 that may present a signal (e.g., VP) to an input 112 of the block 102. The signal VP may be a verify protocol signal. The verification section 104 may be connected to the Device Under Test (DUT) 105. The device under test (DUT) may be a block level design, a full chip design, or other appropriate design. A signal (e.g., TEST) may provide communications between the DUT 105 and the verification block 104. The signal TEST may be implemented as one or more signals, or as a multi-bit signal. The transaction generator section 102 and the verification section 104 may be configured to provide simulation verification of IC designs.

Referring to FIG. 2, a more detailed diagram of the system 100 is shown. The section 102 generally comprises a block (or section) 120, a block (or section) 122 and a block (or section) 124. The block 120 may be implemented as a transaction builder. The block 122 may be implemented as an exception handler. The block 124 may be implemented as a checker.

The block 124 may have an output 126 that may present a signal (e.g., AC) to an input 128 of the exception handler 122. The signal AC may be presented when an abnormal completion occurs. The block 124 may also have an output 130 that may present a signal (e.g., NC) to an input 132 of the transaction builder block 120. The signal NC may be presented when a normal completion occurs. The block 122 may have an output 134 that may present a signal (e.g., ROT) to an input 136 of the block 120. The signal ROT may be implemented as a rebuild old transaction signal.

The block 104 may be implemented as a model block. The device under test (DUT) 105 may be a block level design, a full chip design, or other appropriate design. The model block 104 may have an input/output 144 that may interface with the signal(s) TEST through an input/output 146 of the DUT block 105.

Referring to FIG. 3, an operation 200 of the present invention is shown. The operation 200 generally comprises a state 202, a state 204, a decision state 206, a state 208 and a state 210. At a state 202, the transaction generator 120 may generate a transaction (e.g., the signal STTS) according to the current parameters in the test pattern. For example, the transaction generator 120 may generate an array of values (e.g., address, data, and/or control signals) to be driven on each clock pulse for the entire transaction. The array of values for each clock pulse may then be passed to the model driver 140 during STTS. On each clock pulse the model driver 140 may load (or read) a new set of values from the array.

At a state 204, the loaded values may be driven to the DUT 142. At a state 206, the checker 124 may check (or verify) a protocol on every clock pulse of the transaction. The checker 206 may determine if an abnormal condition occurs (e.g., the signal AC). At a state 208, if an abnormal condition appears, the checker 124 may store relevant information and pass the information back to the exception handler 122 via the signal AC and proceed to the state 210. If a normal condition is detected, the checker 124 may pass the signal NC to the transaction generator 120 and the method 200 may return to the state 202.

At the state 210, the exception handler 122 may then modify the parameters (or conditions) for the transaction generator 120 via the signal ROT. The updated parameters may then generate a modified transaction, which may be sent to the model block 140 via transactions over the bus STTS. For example, if the checker 124 detects that the DUT 142 indicates an abort, then a modified transaction may indicate to release all signals.

Since the transaction generator 120 may be required to know when to modify an original transaction, the checker 124 and the transaction generator 120 may be linked to function simultaneously. The checker 124 may therefore become increasingly integrated into the transaction generator design (e.g., not an optional device). Additionally, the speed of a simulation may then be placed with the simulator itself, since callbacks to third party code are less frequent.

The various signals of the present invention may be implemented as single-bit or multi-bit signals in a serial and/or parallel configuration.

Appropriate hardware design language (e.g., Verilog, VHDL, etc.) may be used to implement the present invention. The present invention, although described as a methodology, may be implemented as a single (or multiple) hardware device(s).

The function performed by the flow diagram of FIG. 3 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for simulating verification of an integrated circuit (IC) design, comprising the steps of:

(A) generating a plurality of first signals using a first language;

(B) testing said design using a second language in response to said first signals;

(C) generating an exception during the step (B); and (D) modifying said first signals in response to said exception.

2. The method according to claim 1, further comprising a step of:

generating a second signal in response to said exception.

3. The method according to claim 2, further comprising a step of:

generating a third signal in response to said second signal for handling said exception, wherein step (D) modifies said first signals in response to said third signal.

4. The method according to claim 3, further comprising a step of:

generating a normal completion signal in response to a normal completion during the step (B) to continue the step (A).

5. The method according to claim 1, wherein the step (A) and the step (B) are simultaneously performed.

6. The method according to claim 1, wherein a speed of said simulation IC design verification is dependent upon a simulation speed.

7. The method according to claim 1, wherein the step (B) comprises a sub-step of:

generating a reduced number of callbacks to said uses of said first language.

8. The method according to claim 1, further comprising the steps of:

performing a design verification; and testing a device implementing said design.

9. The method according to claim 8, wherein said first signals form one or more transactions and said testing step comprises a sub-step of:

testing said device with said one or more transactions.

10. The method according to claim 1, wherein said second language comprises a simulation language of a simulator.

11. An apparatus comprising:

means for generating a plurality of first signals using a first language;

means for testing a design using a second language in response to said first signals;

means for generating an exception during said testing; and means for modifying said first signals in response to said exception.

12. An apparatus comprising:

a generator written in a first language and configured to (i) generate a plurality of first signals and (ii) modify said first signals in response to an exception; and a model driver written in a second language and configured to (i) test a design in response to said first signals and (ii) generate said exception during said test.

13. The apparatus according to claim 12, further comprising:

an exception handler configured to generate a second signal in response to said exception.

14. The apparatus according to claim 13, wherein said generator is further configured to modify said first signals in response to said second signal.

15. The apparatus according to claim 12, wherein said apparatus is configured to provide simulation verification of integrated circuit (IC) designs.

16. The apparatus according to claim 15, wherein said second language comprises:

a simulator language to reduce overhead associated with said simulation verification.

17. The apparatus according to claim 15, wherein a speed of said simulation verification is dependent upon a simulation speed.

18. The apparatus according to claim 12, wherein said model driver is further configured to perform a reduced number of callbacks to uses of said first language.

19. The apparatus according to claim 12, further comprising:

a check block configured to (i) check a response of said design, (ii) generate a second signal in response to a normal completion of said response, and (iii) generate a third signal in response to said exception.

20. The apparatus according to claim 12, wherein said model driver resides in a simulator to test a device implementing said design.

* * * * *